(12) United States Patent
Kovac et al.

(10) Patent No.: US 11,264,984 B2
(45) Date of Patent: Mar. 1, 2022

(54) SINGLE SUPPLY RF SWITCH DRIVER

(71) Applicant: pSemi Corporation, San Diego, CA (US)

(72) Inventors: David Kovac, Arlington Heights, IL (US); Joseph Golat, Crystal Lake, IL (US); Ronald Eugene Reedy, San Diego, CA (US); Tero Tapio Ranta, San Diego, CA (US); Erica Poole, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/561,859

(22) Filed: Sep. 5, 2019

(65) Prior Publication Data

US 2021/0075420 A1   Mar. 11, 2021

(51) Int. Cl.
*H03K 17/687* (2006.01)
*H03K 3/037* (2006.01)

(52) U.S. Cl.
CPC ......... *H03K 17/6871* (2013.01); *H03K 3/037* (2013.01)

(58) Field of Classification Search
CPC .......................... H03K 17/6871; H03K 3/037
USPC .................................. 327/374–377, 108–112
See application file for complete search history.

(56) References Cited

U.S. PATENT DOCUMENTS

| | | | | |
|---|---|---|---|---|
| 6,753,708 B2* | 6/2004 | Koch, II | .......... | H03K 17/08122 327/108 |
| 6,804,502 B2* | 10/2004 | Burgener | .............. | H03K 17/102 455/333 |
| 7,312,637 B2* | 12/2007 | Washburn | ................ | G11C 5/04 326/104 |
| 2015/0288359 A1* | 10/2015 | Bakalski | .............. | H03K 17/693 307/113 |
| 2016/0380624 A1* | 12/2016 | Wei | ........................ | H03K 5/134 327/281 |
| 2017/0363676 A1* | 12/2017 | Shapiro | .................. | H03K 19/20 |

* cited by examiner

*Primary Examiner* — Tomi Skibinski
(74) *Attorney, Agent, or Firm* — Steinfl + Bruno LLP

(57) ABSTRACT

A single supply RF switch driver. The single supply RF switch driver includes an inverter, where a first resistor has been integrated within the inverter, and the resistor is connected to an RF switch. In one aspect, the integration of the first resistor within the inverter allows for the elimination of a negative power supply for the inverter, while maximizing the isolation achieved in the RF switch. In another aspect, the driver is a configured to have a second resistor integrated within the inverter. A third resistor is connected between the gate of the RF switch and the inverter. In an alternate aspect, the driver operates from a positive power supply and a negative power supply, thus increasing the isolation in the RF switch even further.

7 Claims, 6 Drawing Sheets

SINGLE SUPPLY RF SWITCH DRIVER

BACKGROUND

(1) Technical Field

The present teachings generally relate to radio frequency electronic circuits, and more specifically to a single supply radio frequency switch driver.

(2) Background

Generally, in radio frequency (RF) circuits and systems, it is desirable to maximize the isolation between the input and output RF signals in order minimize leakage from input signals to output signals, because such leakage could degrade the RF output signal. In order to maximize the isolation, most high power RF circuits utilize RF NMOS transistors that are driven by a driver having both a positive and a negative power supply. Further, the control of the gate of the RF NMOS transistor is achieved by connecting a float resistor to the RF switch's gate, and controlling the gate voltage of the RF NMOS transistor by the driver. However, generating a negative power supply on the integrated circuit chip requires complex circuits, and increases the chip costs by consuming die area. Therefore, for simple low power switches, a simple inverter between a positive supply voltage and ground can be utilized instead of using a driver with both positive and negative supplies. Floating the gate voltage of the RF NMOS transistor is still desirable in this case so that the gate to source voltage of the RF NMOS transistor stays constant in order to minimize power loss. However, when the RF NMOS transistor is disabled, it is desirable to bypass the float resistor in order to maximize the isolation between the input and output of the RF NMOS transistor. The RF NMOS transistor is also referred to as RF switch.

Accordingly, there is a need for an apparatus and a method to eliminate the need for generating an on-chip negative power supply, and to allow the use of a single power supply driver while maximizing the isolation between the input and the output of an RF switch utilized in RF applications.

SUMMARY

Various embodiments of a single supply switch driver and methods of maximizing isolation in RF applications are disclosed.

In one disclosed embodiment, a single supply RF switch driver is implemented in an integrated circuit (IC). The single supply switch driver is used to drive an RF switch. The single supply switch driver includes an inverter, where a float resistor has been integrated within the inverter. The use of a single supply to drive the RF switch driver allows the removal of negative supply, which is a desirable object of the present disclosure. Generating a negative supply voltage on the IC chip is complex and costly; therefor allowing the RF switch driver to operate with only one supply voltage would reduce complexities and costs of the IC. Integrating the float resistor into the driver allows for the removal of negative supply requirement while maintaining maximum isolation between the input and the output of the RF switch. By integrating the float resistor into the driver, the float resistor is present in the enable state, while the float resistor is bypassed in the disabled state, thus maximizing the isolation between the input and the output of the RF switch. Furthermore, this approach allows for the feed-through path of the gate to source parasitic capacitance to be shorted out in the disabled state, thus further maximizing the isolation between the input and the output of the RF switch.

In another disclosed embodiment, a single supply RF switch driver is implemented by integrating two float resistors into the driver. This topology is advantageous when driving an RF switch which is used as a shunt switch. By integrating an additional float resistor into the driver, the power handling capability of the shunt RF switch is increased because more than one switch can be stacked together in order to increase isolation. Furthermore, the addition of another resistor into the driver allows for the turn-on and turn-off of the shunt RF switch to be controlled. The control of the turn-on and turn-off of the shunt RF switch is desirable in some applications, such as testing equipment applications, where fast turn-on times are required. Other applications where the control of the turn-on and turn-off is advantageous include configurations where both of the series and shunt RF switches have to be off at the same time.

In yet another disclosed embodiment, a single supply RF switch driver is implemented by integrating two float resistors into the driver, and a third resistor is placed in series with the gate of the shunt RF switch. This topology is advantageous in RF applications that require high power handling capability of the shunt RF switch, because more than one shunt RF switch can be stacked together in order to increase isolation. Furthermore, in this generalized approach, more series RF switches can also be added in order to increase the isolation even further. In yet an alternate version of this embodiment, the driver can use both a positive and a negative power supply in order to increase the isolation yet even further.

In yet another disclosed embodiment, a circuital arrangement is presented, the circuital arrangement comprising: an inverter having a first polarity transistor and a second polarity transistor; a first resistor integrated within the inverter, the first resistor connected at one end to a drain of the first polarity transistor and at the other end to a connection node and to a drain of the second polarity transistor; and an NMOS RF switch having its gate terminal connected to the connection node.

BRIEF DESCRIPTION OF THE DRAWINGS

The disclosed apparatus, in accordance with one or more various embodiments, are described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

Like reference numbers and designations in the various drawings indicate like elements.

Definitions

As used in the present disclosure, the term "float resistor" will be used throughout the present disclosure to mean a resistor that is connected to a circuit node that allows relatively small amount of current through per unit of applied voltage at that node.

As used in the present disclosure, the term "IC" can refer to an integrated circuit or monolithic integrated circuit composed of a set of electronic circuits on one small plate ("chip") of semiconductor material such as silicon. An IC can also be referred to as a "chip".

The term decibel (symbol: dB) is a unit of measurement used to express the ratio of one value of a physical property to another on a logarithmic scale. It can be used to express a change in value (e.g., +1 dB or −1 dB) or an absolute value. In the latter case, it expresses the ratio of a value to a reference value; when used in this way, the decibel symbol should be appended with a suffix that indicates the reference value, or some other property. For example, if the reference value is 1 volt, then the suffix is "V" (e.g., "20 dBV"), and if the reference value is one milli-watt, then the suffix is "m" (e.g., "20 dBm"). The term dBm is a unit of measurement of power. Power, in dBm, is expressed as:

$$P_{dBm} = 10 \log(1000 * V^2/R)$$

where V is rms voltage value and R is resistance value.

As used in the present disclosure, the term insertion loss refers to loss of signal power resulting from the insertion of a device in transmission line and usually is expressed in dB.

DETAILED DESCRIPTION

Figure 1:
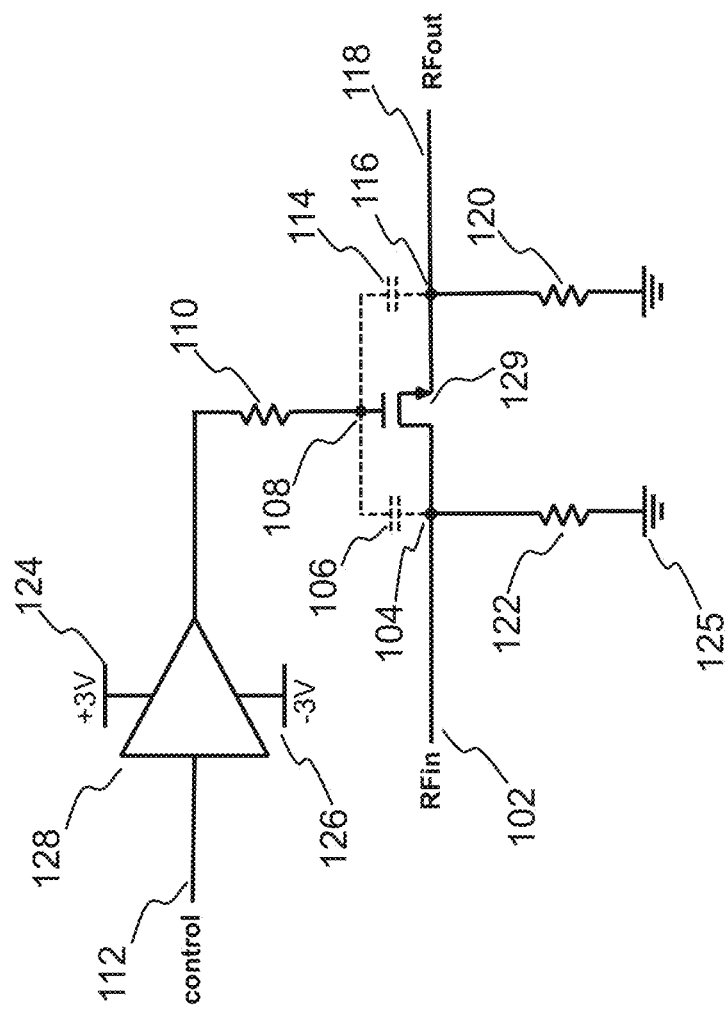
FIG. 1 shows an electrical schematic of a prior art circuit used to drive an RF switch, where the driver utilizes both a positive supply and a negative supply.

FIG. 1 shows an electrical schematic of a prior art circuit used to drive an RF switch 129, where the driver utilizes both a positive supply and a negative supply. The RF switch 129 shown is an NMOS transistor. NMOS transistors will turn on with a high voltage applied to the gate (i.e. above the threshold voltage Vt of the transistor) and will turn off with a low voltage applied to the gate (i.e. below the Vt of the transistor). In this particular example, a high voltage can be approximately +3V, and a low voltage can be approximately −3V.

The circuit driving the RF switch 129 receives a control signal as an input at node 112 and drives the gate 108 of the NMOS transistor from the driver 128 output through a float resistor 110. The control signal at node 112 is generally between 0V and a positive voltage (i.e. 3V). Based on the supply voltages (124, 126) of the driver circuit, the voltages applied to the gate may be high (i.e. +3V) or low (i.e. −3V). If the control signal is high (i.e. +3V), the output of the driver will be +3V. If the control signal is low (i.e. 0V), the output of the driver will be −3V.

The RF switch 129 is in an ON state (i.e. closed) when a positive DC voltage is applied to the gate with respect to the DC voltage on the drain 104 and source 116. During this mode of operation, an RF signal applied to the RFin node 102 will pass through the RF switch to the RFout node 118. In this mode of operation, the RF switch is in a low impedance state.

The RF switch 129 is in an OFF state (i.e. open) when a negative DC voltage is applied to the gate with respect to the DC voltage on the drain 104 and source 116. During this mode of operation, an RF signal applied to the RFin node 102 will be isolated from the RFout node 118. In this mode of operation, the RF switch is in a high impedance state.

As a person skilled in the art will understand, the device characteristics of an NMOS transistor include parasitic capacitance (106) from the drain to gate and parasitic capacitance (114) from the gate to source. This parasitic capacitance will couple the RF signal from drain or source onto the gate. In general, the signal on the gate will be half of the sum of the signals on the drain and source. Therefore, if the NMOS is in an ON state, the RF signal on the source and drain will be almost the same, and the RF signal coupled onto the gate will also be almost the same. If the NMOS transistor is in an OFF state, and RF signal applied at the drain will be isolated from the source, and therefore the RF signal coupled onto the gate will be approximately half of the signal on the drain.

The purpose of the float resistor 110 is to allow the gate of the transistor to maintain a DC bias from the driver circuit 128 while maintaining the RF signal coupled from the drain and/or source. Without the float resistor 110, the coupled RF signal would appear directly at the driver circuit output.

In the prior art circuit of FIG. 1, resistors 122 and 120, which have very large values of resistance (e.g. 20 kΩ), provide isolation between the drain 104 and ground node 125, and between the source 116 and ground node 125. Resistors 122 and 120 are used to DC bias the drain/source of the RF switch at 0V. It will be understood by those skilled in the art that biasing resistors, such as 122 and 120, as shown throughout the present disclosure, are only needed if the RF switch is capacitively coupled and would not be needed if the RF switch is DC coupled. The driver 128 operates from a positive power supply 124 and a negative power supply 126, for example, +3 V and −3 V, respectively. The drawback of this prior art topology is the requirement of generating a negative voltage supply for the driver 128. Generating a negative voltage supply on an integrated circuit chip requires complex circuits, and increases the chip costs by consuming die area.

Figure 2:
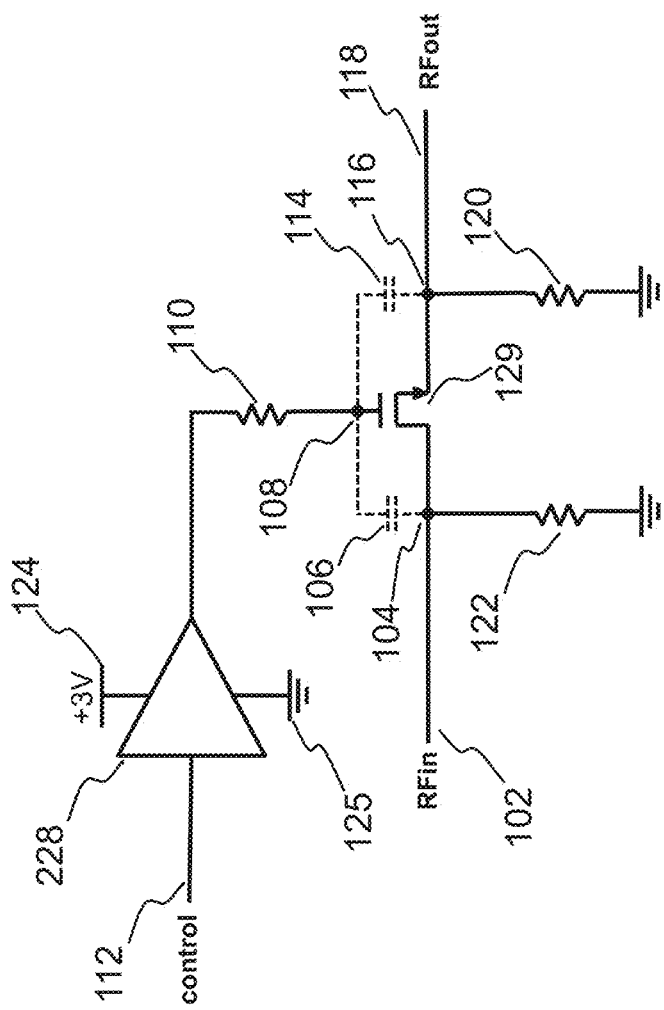
FIG. 2 shows an electrical schematic of a prior art circuit used to drive an RF switch, where the driver utilizes a single positive supply.

FIG. 2 shows an electrical schematic of a prior art circuit used to drive an RF switch, where the driver utilizes a single positive supply, i.e. the negative power supply for the driver 228 has been replaced by ground node 125. This topology eliminates the need for generating a negative power supply. The operation of this topology in the enabled mode is similar to the operation of the topology of FIG. 1 in the enabled mode, thus the DC voltage between the gate 108 and the source 116 of the RF switch remains positive. In the disabled mode, the DC voltage between the gate 108 and the source 116 of the RF switch cannot go negative because the driver 228 has ground as its lowest voltage supply. The RF switch does remain OFF because the gate voltage is below the threshold voltage of the device, however the isolation of the RF switch is not as high as if it were negatively biased.

The drawback of the prior art circuit of FIG. 2 with respect to FIG. 1 is that the isolation between the RF node 102 and the RF node 118 is worse in the disabled mode. This degradation of isolation is due to the fact that the gate to source voltage of RF switch 129 cannot go negative in the OFF state.

The following figures show various embodiments of the present disclosure where the topology of FIG. 2 is modified to address the issue of isolation.

Figure 3:
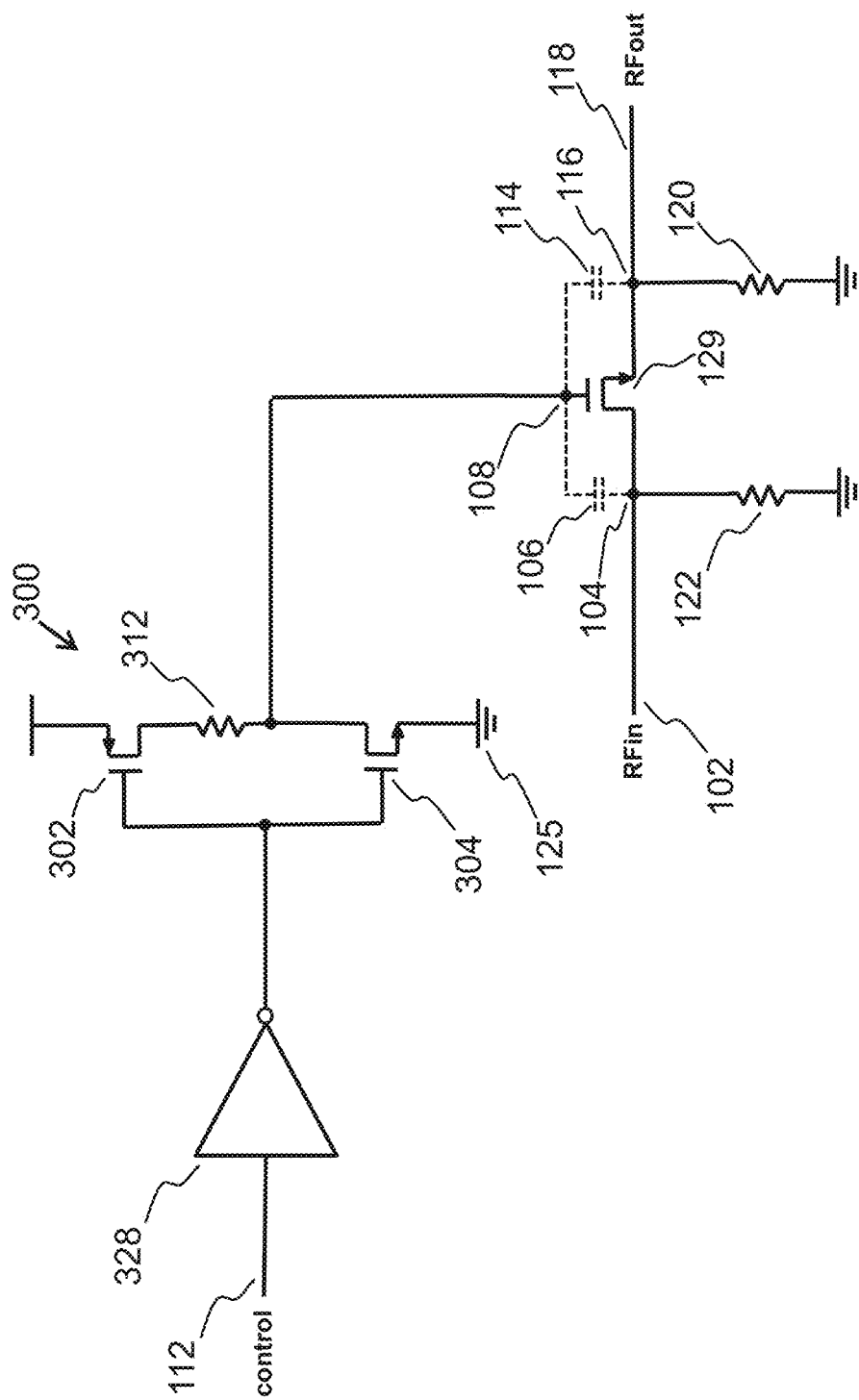
FIG. 3 shows an electrical schematic of a single supply driver in accordance with a preferred embodiment of the disclosed apparatus, wherein a float resistor has been integrated within the driver. The driver is shown driving as RF switch, where the RF switch is configured in series with input and output signals.

FIG. 3 shows an electrical schematic of a circuital arrangement of a single supply driver in accordance with a preferred embodiment of the disclosed apparatus, wherein a float resistor 312 has been integrated within the driver 300. The driver 300 consists of an inverter, where resistor 312 has been placed in series with the drain of the PMOS transistor 302 and the output of the driver. The driver 300 receives a control signal as an input at node 112 and drives the gate 108 of the NMOS transistor 129. As a person skilled in the art will understand, proper signals are required for the control signal. For example, to put the NMOS transistor 129 in an ON state, the signal at the gate 108 of the NMOS transistor 129 will be high. To put the NMOS transistor in an OFF state, the signal at the gate 108 of the NMOS transistor 129 will be low. In the enabled mode, the resistor 312 behaves in similar fashion as the resistor 110 of FIG. 2 in that the positive supply is connected to the gate through transistor 302 and resistor 312. All of the RF voltage drops across the drain to gate node since there is no capacitive division as the gate is grounded. In the disabled mode, the gate 108 of the RF switch 129 is directly connected to the ground node 125 through transistor 304. In this topology, the effective parasitic capacitance coupling between gate 108 to source 104 is also eliminated (not completely eliminated, but greatly reduced), thus increasing the isolation in the RF switch. As an example, 12 dB improvement in isolation was achieved using this approach compared to the isolation achieved in the prior art circuit of FIG. 2.

The configuration of FIG. 3, where the float resistor is integrated within the driver having a single supply voltage, is best suited for low power applications such as applications where the power levels are approximately −10 dBm or lower.

Figure 4:
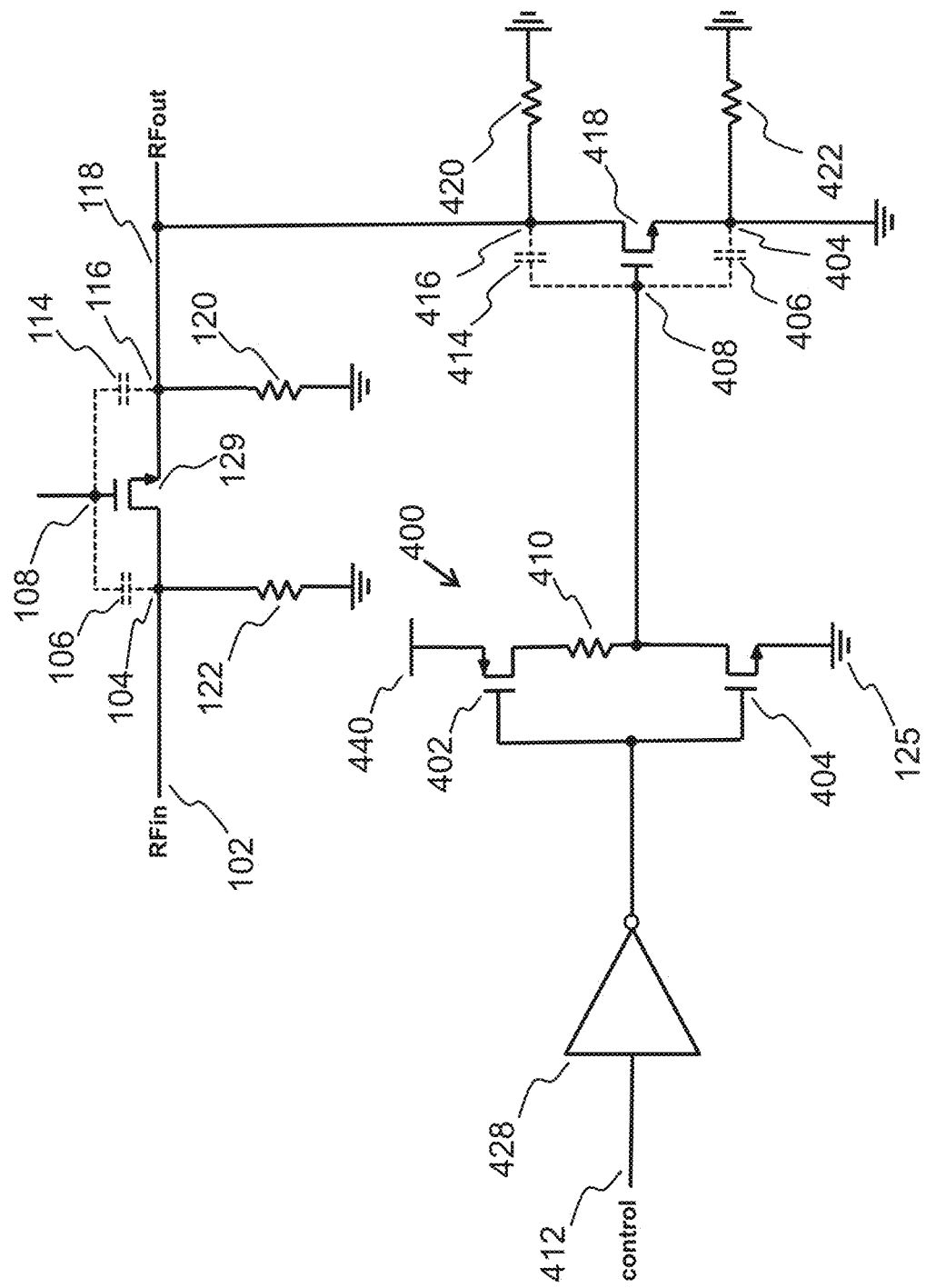
FIG. 4 shows an electrical schematic of a single supply driver in accordance with another embodiment of the disclosed apparatus, wherein a float resistor has been integrated within the driver, and the driver is driving a shunt RF switch.

FIG. 4 shows an electrical schematic of a circuital arrangement of a single supply driver in accordance with another embodiment of the disclosed apparatus, wherein a driver 400 is driving a shunt RF switch 418. In this topology, resistor 410 has been integrated into the driver 400. The driver 400 consists of an inverter, where resistor 410 has been placed in series with the drain of a PMOS transistor 402 and the output of the driver 400. The driver 400 receives a control signal as an input at node 412 and drives the gate 408 of the NMOS transistor 418. As a person skilled in the art will understand, proper signals are required for the control signal. The driver 400 operates between a positive power supply 440 and a ground 125. The RF switch 418 shown is an NMOS transistor. When the RF switch 418 is used as a shunt switch, there is no longer an RF voltage divider formed by the parasitic capacitors 414 and 406, as parasitic capacitor 406 gets shorted out when the shunt switch 418 is OFF because the DC voltage on the gate and source is 0V. Therefore, the voltage from the drain 416 to the gate 408 of the shunt switch 418 during the OFF state is approximately twice as large as in the comparable configuration of the RF switch of FIG. 2. In FIG. 4, resistors 422 and 420, which have very large values of resistance (e.g. 20 k Ω), provide isolation between the drain 416 and ground node 125, and between the source 404 and ground node 125.

As a person skilled in the art will recognize, a similar operation will occur for a circuital arrangement of a single supply driver where the driver is driving a series RF switch. As previously described, there is no longer an RF voltage divider formed by the parasitic capacitors of the series switch, and therefore all of the RF voltage presented to the switch gets dropped across the drain to gate node.

Figure 5:
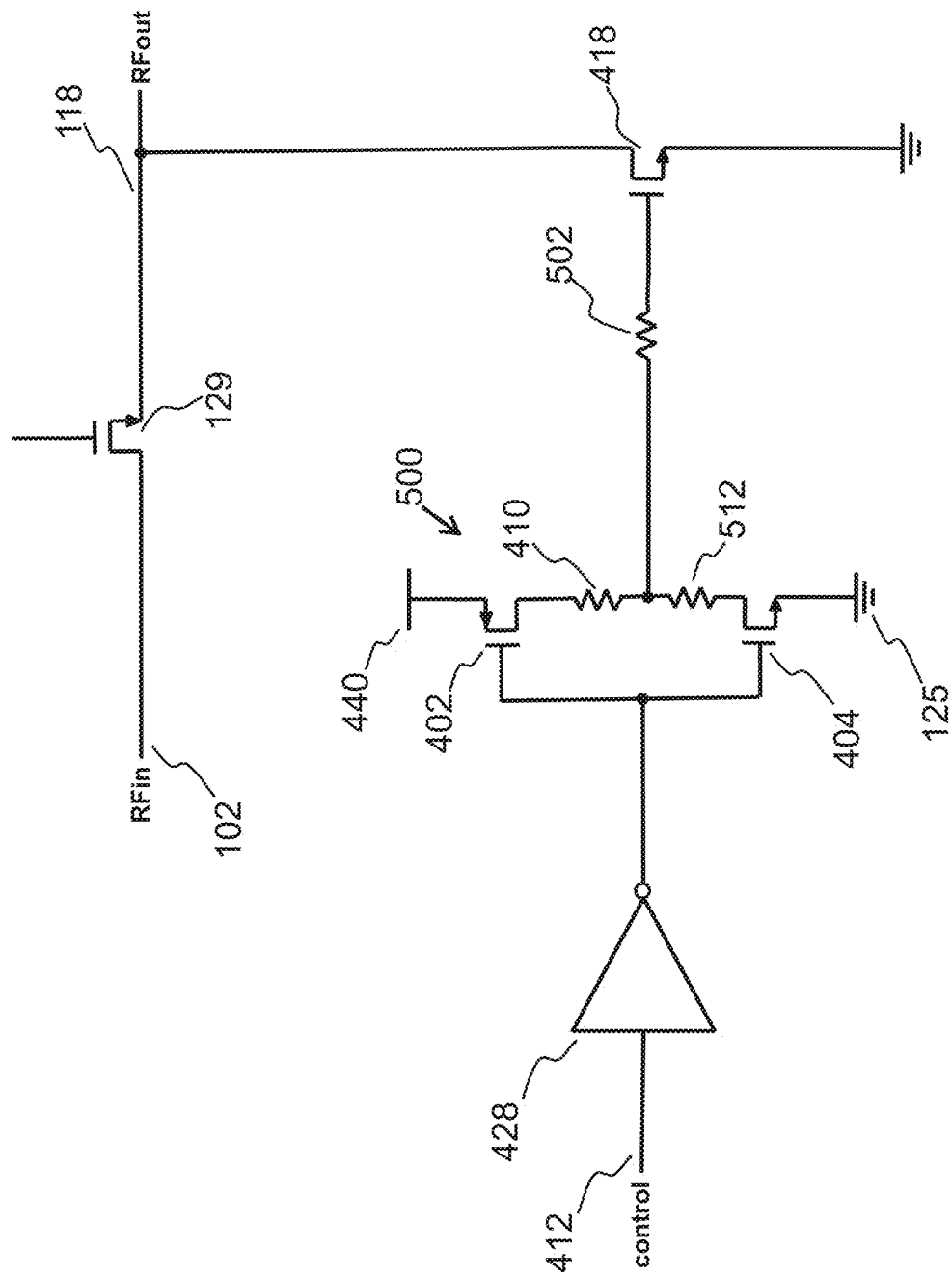
FIG. 5 shows an electrical schematic of a single supply driver in accordance with yet another alternate embodiment of the disclosed apparatus, wherein two resistors have been integrated into the driver and a float resistor is configured in series with the gate of the shunt RF switch.

FIG. 5 shows an electrical schematic of a circuital arrangement of a single supply driver in accordance with yet another alternate embodiment of the disclosed apparatus, wherein two resistors 410 and 512 have been integrated into a driver 500, and a third resistor 502 is configured in series with the gate of the shunt RF switch 418. The driver works from a positive power supply 440 and a ground 125. The driver 500 consists of an inverter, where resistor 410 has been placed in series with the high supply and the inverter output and resistor 512 has been placed in series with the low supply and the inverter output. The driver 500 receives a control signal as an input at node 412 and drives the gate of the NMOS transistor 418 through the resistor 502. As a person skilled in the art will understand, proper signals are required for the control signal. Resistor 502 is connected between the output of the inverter and the gate of the shunt RF switch 418. The existence of resistors 410 and 512 allows for the turn-on time and the turn-off time of the shunt RF switch to be designed such the turn-on and turn-off times have different values. For example, by having a value for the resistor 512 which is larger than the value of resistor 410, the turn-off time of the shunt RF switch will be longer than its turn-on time. This is desirable in some applications such as testing equipment applications, where fast turn-on times are required. Other applications where this feature is desirable include applications where it is required for both the shunt RF switch 418 and the series RF switch 129 to be off simultaneously for a period of time during the state transition.

In FIG. 5, the addition of third resistor 502 between the driver 500 and the shunt RF switch 418 allows additional shunt RF switches to be stacked, therefore improving isolation, linearity and power handling.

Figure 6:
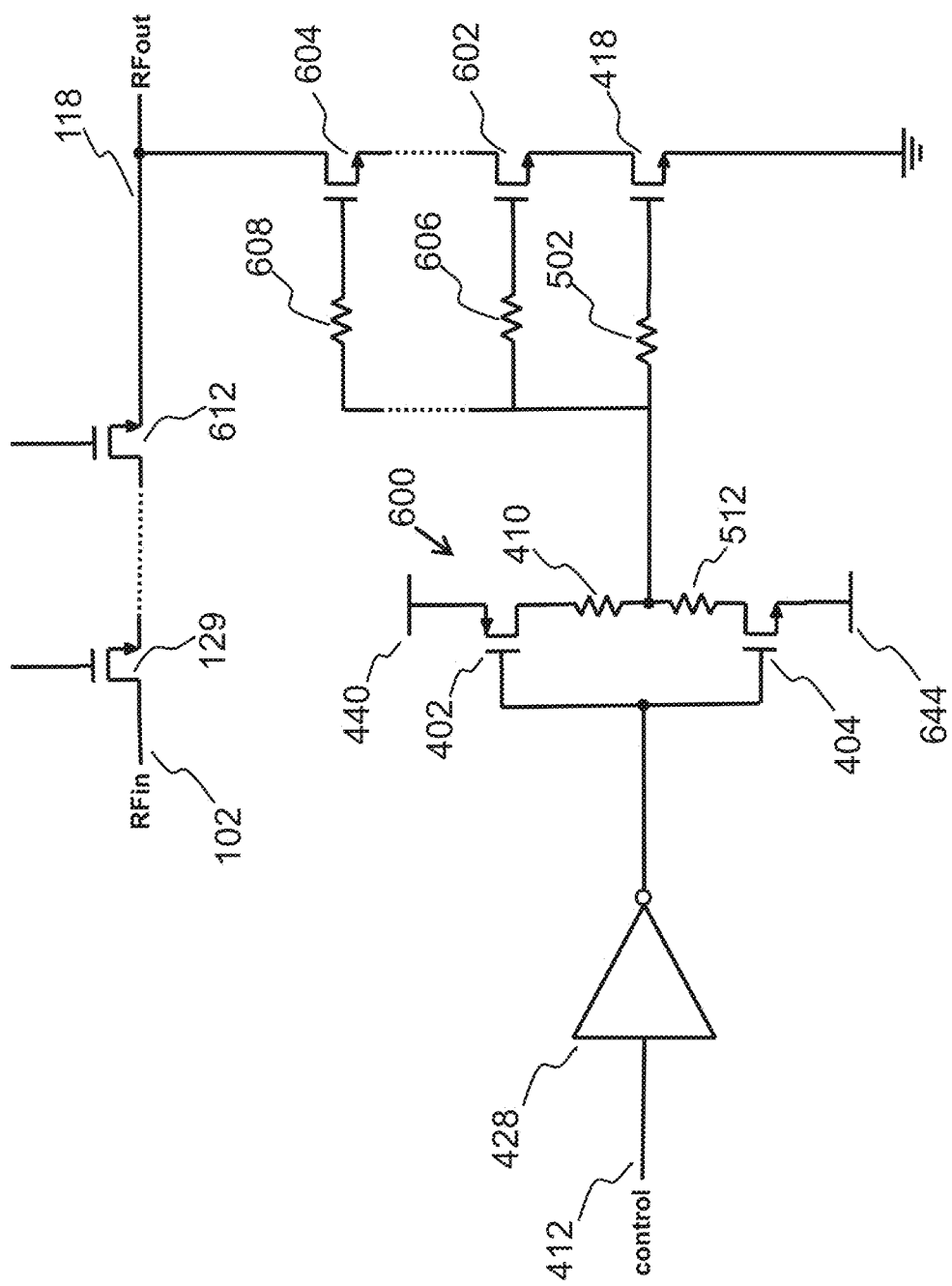
FIG. 6 shows an electrical schematic of a single supply driver in accordance with yet another alternate embodiment of the disclosed apparatus, wherein two resistors have been integrated into the driver and a float resistor is configured in series with the gate of the shunt RF switch, and multiple shunt and series RF switches are utilized.

It will be understood by those skilled in the art that the approaches described in FIG. 3 to FIG. 5 can be generalized, as shown in FIG. 6. In FIG. 6 a schematic of a circuital arrangement has been shown where any number of shunt RF switches can be stacked, as well as any number of series RF switches can be stacked. This configuration will increase the isolation, as well as enable usage in high power applications due to voltage division across the RF switches. In this exemplary figure, shunt switches 418, 602 and 604 are shown, where they are stacked. Series RF switches 129 and 612 are shown stacked (driver circuits for the series RF switches, which are similar to that shown for the shunt transistor stack, are not shown). The dashed lines indicate that any number of shunt or through RF switches can be connected in order to increase the isolation. Driver 600 can work from a single supply voltage 440 and ground, or from two supply voltages 440 and 644, in order to increase the isolation even further.

It will be understood by those skilled in the art that the design of these circuit configurations involve design trade-offs, such as die area vs. increased amount of isolation. A topology with increased isolation is suitable for use in high power or high isolation applications. As another example of design trade-offs, the disclosed topology of FIG. 3, where the resistor 312 is integrated within the driver, provides increased isolation for use in single supply driver topologies and allows the elimination of a shunt transistor, thus saving die area and cost. In FIG. 6, the addition of a negative power supply to the driver 600 provides increased isolation at the expense of sacrificing die area.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the presently claimed subject matter may be implemented in other transistor technologies such as bipolar, GaAs HBT, GaN HEMT, GaAs pHEMT, and MESFET technologies. The presently claimed subject matter has been shown in relation to NMOS RF switches, however the presently claimed subject matter may be implemented in relation with PMOS RF switches as well. The Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims.

What is claimed is:

1. A radio frequency (RF) circuit comprising:
   a first RF node;
   a second RF node;
   a control input;
   a series switch coupled between the first RF node and the second RF node, the series switch comprising at least a first metal-oxide-semiconductor field effect transistor (MOSFET);
   a shunt switch coupled between the first RF node and a ground node, the shunt switch comprising at least a second MOSFET and a gate resistor; and
   a driver circuit coupled to the shunt switch;
   wherein a turn on time of the shunt switch is different than a turn off time of the shunt switch.

2. The RF circuit of claim 1, the driver circuit further comprising:
   a supply voltage input,
   a driver output,
   a first driver MOSFET with its source coupled to the supply voltage input,
   a second driver MOSFET with its source coupled to ground,
   a first driver resistor coupled between a drain of the first driver MOSFET and the driver output, and
   a second driver resistor coupled between a drain of the second driver MOSFET and the driver output
   wherein a first resistance of the first driver resistor is different than a second resistance of the second driver resistor.

3. The RF circuit of claim 2, wherein the first resistance of the first driver resistor is higher than the second resistance of the second driver resistor.

4. The RF circuit of claim 1, wherein the shunt switch further comprises:
   a plurality of MOSFETs and a plurality of gate resistors, wherein each of the plurality of MOSFETs is coupled to a respective gate resistor of the plurality of gate resistors.

5. The RF circuit of claim 4, the driver circuit further comprising:
   a first supply voltage input,
   a second supply voltage input,
   a driver output,
   a first driver MOSFET with its source coupled to the first supply voltage input,
   a second driver MOSFET with its source coupled to the second supply voltage input,
   a first driver resistor coupled between a drain of the first driver MOSFET and the driver output, and
   a second driver resistor coupled between a drain of the second driver MOSFET and the driver output
   wherein a first resistance of the first driver resistor is different than a second resistance of the second driver resistor.

6. The RF circuit of claim 5, wherein the first resistance of the first driver resistor is higher than the second resistance of the second driver resistor.

7. The RF circuit of claim 5, wherein the second supply voltage input is coupled to a negative voltage.

* * * * *